(12) United States Patent
Ono

(10) Patent No.: US 10,297,514 B2
(45) Date of Patent: May 21, 2019

(54) THERMAL PROCESSING METHOD AND THERMAL PROCESSING APPARATUS THROUGH LIGHT IRRADIATION

(71) Applicant: SCREEN Holdings Co., Ltd., Kyoto (JP)

(72) Inventor: Yukio Ono, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 0 days.

(21) Appl. No.: 15/884,456

(22) Filed: Jan. 31, 2018

(65) Prior Publication Data

US 2018/0151455 A1 May 31, 2018

Related U.S. Application Data

(63) Continuation of application No. 15/334,375, filed on Oct. 26, 2016, now Pat. No. 9,922,889.

(30) Foreign Application Priority Data

Nov. 4, 2015 (JP) .................................. 2015-216535

(51) Int. Cl.
*H01L 21/00* (2006.01)
*H01L 21/66* (2006.01)
(Continued)

(52) U.S. Cl.
CPC .............. *H01L 22/20* (2013.01); *C23C 14/02* (2013.01); *C23C 14/48* (2013.01);
(Continued)

(58) Field of Classification Search
CPC ............. H01L 21/324; H01L 21/67115; H01L 21/67248; H01L 21/2253; H01L 22/20; C23C 14/02; C23C 14/48
See application file for complete search history.

(56) References Cited

U.S. PATENT DOCUMENTS

| 4,649,261 A | 3/1987 | Sheets ........................... 219/390 |
| 5,809,211 A | 9/1998 | Anderson ..................... 118/725 |

(Continued)

FOREIGN PATENT DOCUMENTS

| JP | 60-258928 | 12/1985 |
| JP | 2005-527972 | 9/2005 |

(Continued)

OTHER PUBLICATIONS

Taiwanese Office Action for Taiwan Application No. 105134068 dated Aug. 24, 2017 with Japanese translation and English partial translation based on the Japanese translation.

(Continued)

*Primary Examiner* — Richard A Booth
(74) *Attorney, Agent, or Firm* — Ostrolenk Faber LLP

(57) ABSTRACT

A susceptor is preheated through light irradiation by a halogen lamp before the first semiconductor wafer of a lot as a processing target is transferred into a chamber. The temperature of the susceptor is measured by a radiation thermometer. A control unit is configured to control the output of the halogen lamp so that the temperature of the susceptor reaches a stable temperature based on a result of the measurement of the temperature of the susceptor by the radiation thermometer. The stable temperature of the susceptor is the temperature of the susceptor when the temperature of the susceptor is risen to a constant temperature by continuously performing light irradiation heating on a plurality of semiconductor wafers in the chamber without heating the susceptor.

4 Claims, 10 Drawing Sheets

(51) Int. Cl.
- *C23C 14/02* (2006.01)
- *C23C 14/48* (2006.01)
- *H01L 21/225* (2006.01)
- *H01L 21/324* (2006.01)
- *H01L 21/67* (2006.01)

(52) U.S. Cl.
CPC ........ *H01L 21/2253* (2013.01); *H01L 21/324* (2013.01); *H01L 21/67115* (2013.01); *H01L 21/67248* (2013.01)

(56) References Cited

U.S. PATENT DOCUMENTS

| | | | |
|---|---|---|---|
| 2003/0183612 A1 | 10/2003 | Timans et al. | 219/390 |
| 2008/0169282 A1 | 7/2008 | Sorabji | 219/444.1 |
| 2011/0089166 A1 | 4/2011 | Hunter et al. | 219/647 |

FOREIGN PATENT DOCUMENTS

| | | |
|---|---|---|
| JP | 2009-188082 A | 8/2009 |
| JP | 2010-238789 A | 10/2010 |
| JP | 2015-130423 A | 7/2015 |

OTHER PUBLICATIONS

Office Action dated Feb. 14, 2018 in counterpart Taiwan Application No. 105134068 with Japanese translation and English partial translation based on the Japanese translation.

Office Action (Notification of Reasons for Refusal) dated Mar. 5, 2019 in counterpart Japanese Patent Application No. 2015-216535 with partial English translation.

F I G. 2
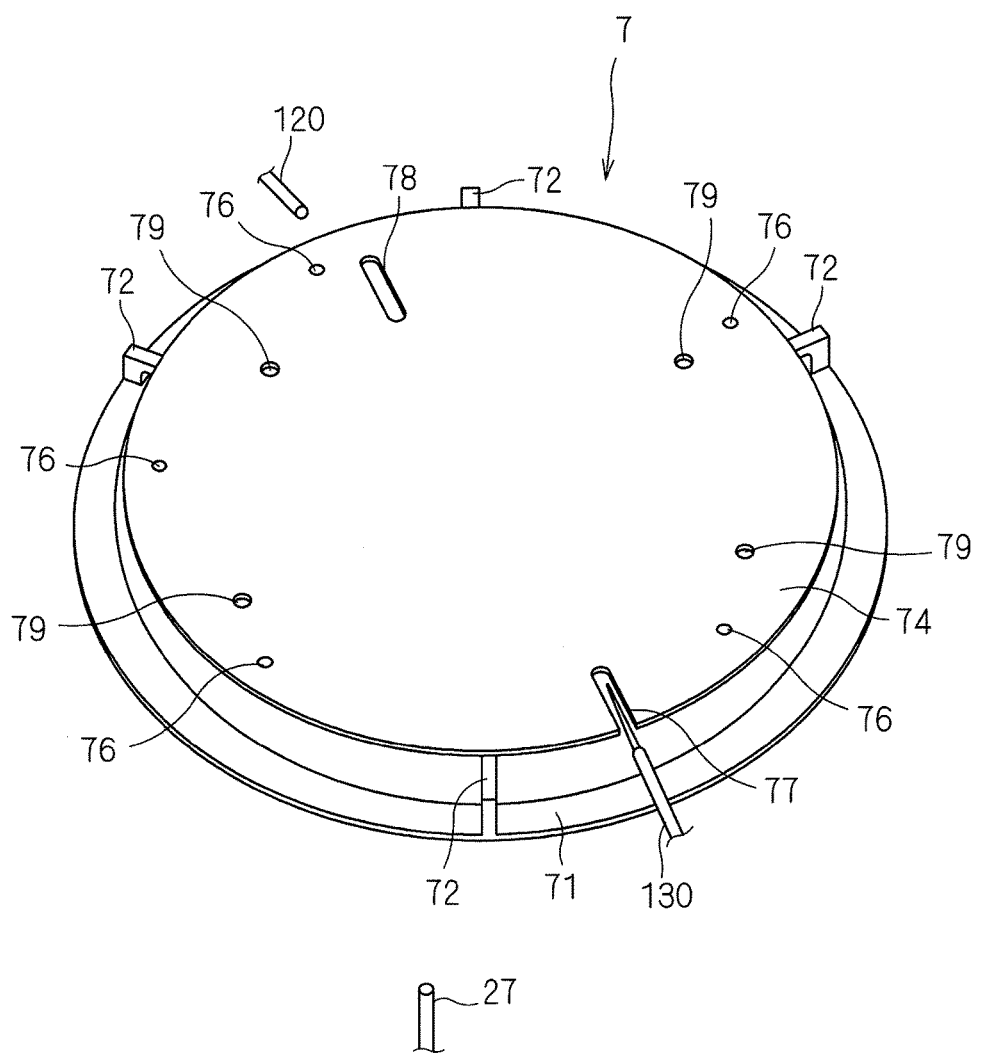

F I G. 4
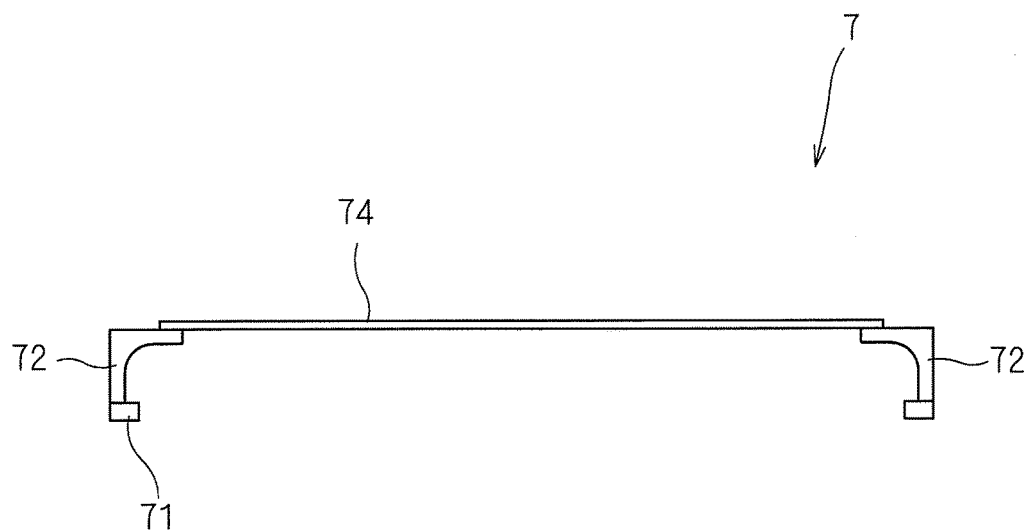

F I G. 5
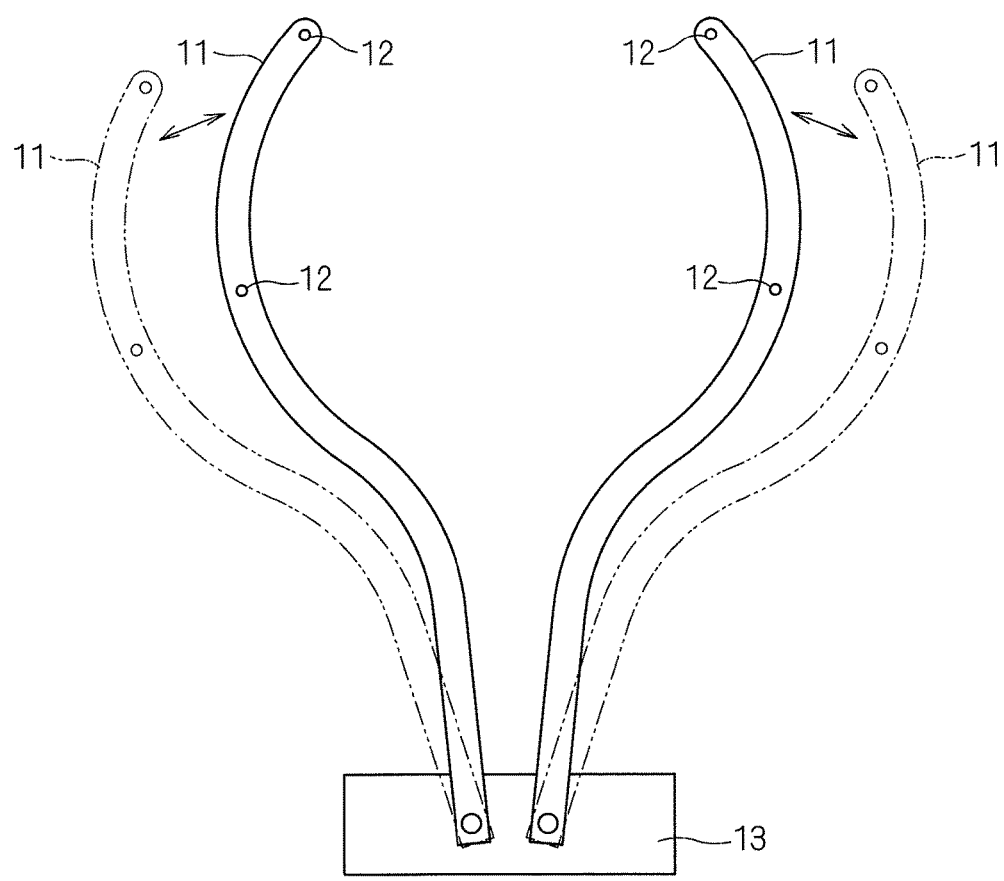

F I G. 6
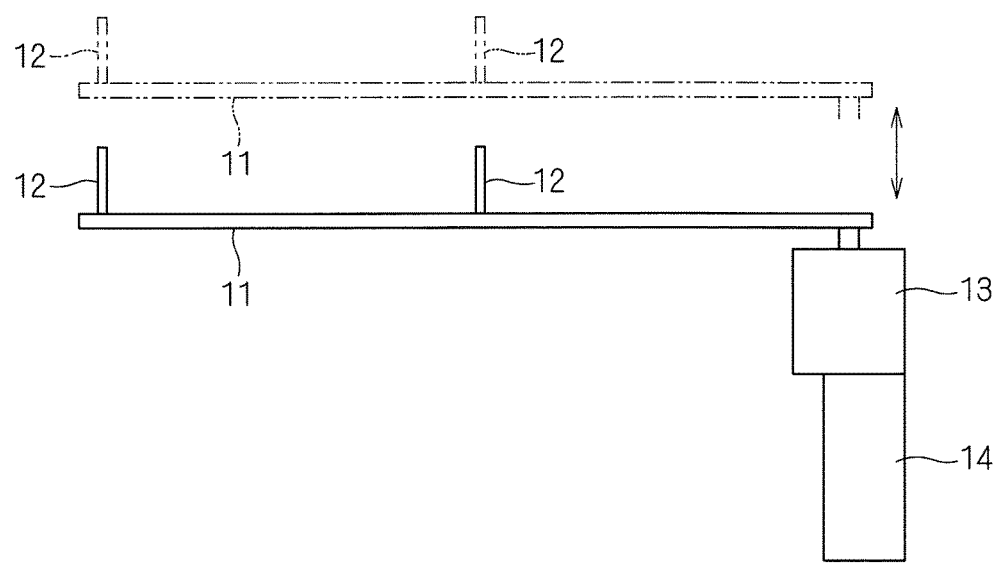

F I G . 7
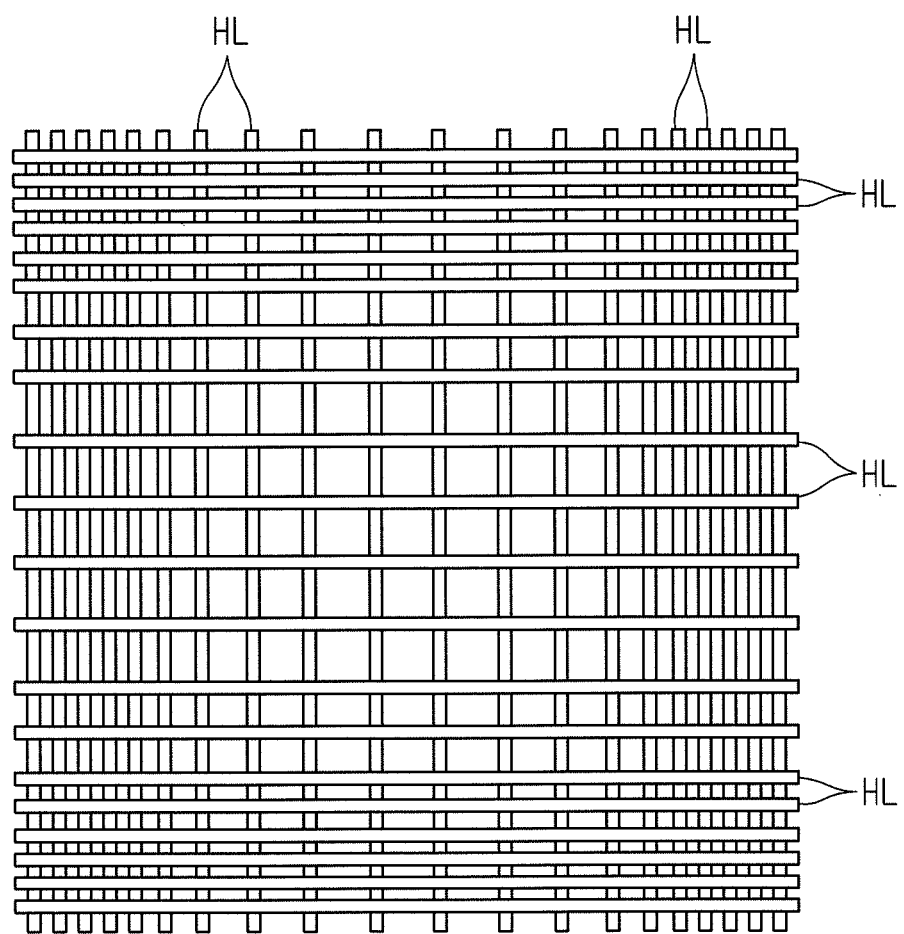

THERMAL PROCESSING METHOD AND THERMAL PROCESSING APPARATUS THROUGH LIGHT IRRADIATION

CROSS REFERENCE TO RELATED APPLICATIONS

The present application is a continuation under 37 C.F.R. § 1.53(b) of prior application Ser. No. 15/334,375, filed Oct. 26, 2016, in the name of Yukio ONO entitled THERMAL PROCESSING METHOD AND THERMAL PROCESSING APPARATUS THROUGH LIGHT IRRADIATION, which claims priority to Japanese Application No. 2015-216535, filed Nov. 4, 2015.

BACKGROUND OF THE INVENTION

Field of the Invention

The present invention relates to a thermal processing method and thermal processing apparatus of heating a thin-plate fine electronic substrate (hereinafter simply referred to as a "substrate") such as a semiconductor wafer to which impurities are introduced, by irradiating the substrate with light.

Description of the Background Art

In a process of manufacturing a semiconductor device, impurity introduction is a process necessary for forming a p-n junction in a semiconductor wafer. Currently, a typical impurity introduction is achieved by an ion implantation technique and a subsequent annealing technique. The ion implantation technique is a technology in which impurity elements such as boron (B), arsenic (As), and phosphorus (P) are ionized to collide onto a semiconductor wafer with a high acceleration voltage and physically perform impurity implantation. Implanted impurities are activated through anneal processing. In this process, an annealing time of several seconds or longer allows the implanted impurities to deeply diffuse by heat to have a junction depth much larger than required, potentially causing difficulties in favorable device formation.

For this reason, flash lamp annealing (FLA) has attracted attention recently as an anneal technology of heating a semiconductor wafer in an extremely short time. The flash lamp annealing is a thermal processing technology of rising temperature only at the surface of a semiconductor wafer in which impurities are implanted, in an extremely short time (several milliseconds or less) by irradiating the surface of the semiconductor wafer with flash light using a xenon flash lamp (hereinafter, a simple notation of "flash lamp" means the xenon flash lamp).

The xenon flash lamp has an emission spectral distribution ranging from ultraviolet to near-infrared, and has a wavelength shorter than that of the conventional halogen lamp, which is substantially the same as the fundamental absorption band of a silicon semiconductor wafer. Thus, when the semiconductor wafer is irradiated with flash light from the xenon flash lamp, less light is transmitted and thus the temperature of the semiconductor wafer can be rapidly risen. It has been found that the flash light irradiation in an extremely short time less than several milliseconds can selectively rise temperature only at the vicinity of the surface of the semiconductor wafer. Thus, when the xenon flash lamp is used to rise temperature in an extremely short time, only impurity activation can be executed without diffusing impurities deeply.

U.S. Pat. No. 4,649,261 and US2003/0183612 each disclose a thermal processing apparatus employing such a xenon flash lamp, which performs desired thermal processing through a combination of a pulsed emission lamp such as a flash lamp provided on a front surface side of a semiconductor wafer, a continuously lighting lamp such as a halogen lamp provided on a back surface side thereof. In the thermal processing apparatus disclosed in U.S. Pat. No. 4,649,261 and US2003/0183612, the semiconductor wafer is preheated to a certain temperature by, for example, a halogen lamp and thereafter risen to a desired processing temperature through pulse heating by the flash lamp.

Typically, processing, such as thermal processing, of a semiconductor wafer is performed in units of lots (a set of semiconductor wafers to be provided with processing of identical contents under identical conditions). In substrate processing apparatus, of which a semiconductor wafer processing is performed one by one continuously and sequentially on a plurality of semiconductor wafers included in a lot. In a flash lamp anneal apparatus, a plurality of semiconductor wafers included in a lot are transferred into a chamber one by one and are sequentially subject to the thermal processing.

When a flash lamp anneal apparatus that is not operational starts processing of a lot, the first semiconductor wafer of the lot is transferred into a chamber substantially at room temperature and then subject to the heating processing. At the heating processing, the semiconductor wafer supported by a susceptor in the chamber is preheated to a predetermined temperature and then risen to a processing temperature by flash heating. As a result, thermal conduction occurs from the semiconductor wafer the temperature of which has risen to the susceptor and the like in the chamber, and the temperatures of the susceptor and the like rise accordingly. Such an increase in the temperatures of the susceptor and the like due to the heating processing of the semiconductor wafer continues for few semiconductor wafers following the first semiconductor wafer. Eventually when the heating processing is performed on approximately 10 semiconductor wafers, the temperature of the susceptor reaches a stable temperature. In other words, the first semiconductor wafer of the lot is processed being supported by the susceptor at room temperature, whereas the tenth or later semiconductor wafer is processed being supported by the susceptor the temperature of which has risen to the stable temperature.

This causes such a problem that a temperature history is ununiform among a plurality of semiconductor wafers included in the lot. In particular, since several semiconductor wafers following the first semiconductor wafer of the lot are processed being supported by the susceptor at relatively low temperatures, a temperature reached on the surface at the flash light irradiation potentially does not reach the processing temperature. When a semiconductor wafer supported by the susceptor at low temperature is irradiated with flash light, wafer warpage occurs in some cases because of a temperature difference between the susceptor and the semiconductor wafer, and as a result, the semiconductor wafer is potentially damaged.

For these reasons, in the conventional technology, before processing of a lot is started, a dummy wafer that is not a processing target is transferred into the chamber to be supported by the susceptor and is subject to the flash heating processing under condition identical to that of the lot to be processed, so as to rise the temperatures of the susceptor and the like in the chamber in advance (dummy running). The flash heating processing is performed on about 10 dummy wafers, so that, for example, the susceptor reaches a stable temperature, and thereafter, processing of the first semiconductor wafer of the lot to be processed is started. In this manner, a uniform temperature history can be achieved for a plurality of semiconductor wafers included in the lot, and additionally, wafer warpage due to a temperature difference between the susceptor and a semiconductor wafer can be prevented.

However, in such dummy running, a dummy wafer that is not a processing target is consumed, and it takes a considerable time to perform the flash heating processing on about 10 dummy wafers, preventing efficient operation of the flash lamp anneal apparatus.

SUMMARY OF THE INVENTION

The present invention is intended to provide a thermal processing method of heating a substrate by irradiating the substrate with light.

According to an aspect of the present invention, the thermal processing method includes the steps of: (a) transferring a substrate into a chamber to place the substrate on a susceptor; (b) irradiating the substrate placed on the susceptor with light; (c) measuring the temperature of the susceptor before the first substrate of a lot is transferred into the chamber; and (d) heating the susceptor based on a result of the measurement in the step (c).

A uniform temperature history can be achieved for all substrates of the lot without dummy running.

Preferably, in the step (c), temperature is measured at a plurality of places on the susceptor, and in the step (d), heating control is performed for each region including one of the plurality of places.

This achieves an improved accuracy of heating the susceptor.

The present invention is also intended to provide a thermal processing apparatus configured to heat a substrate by irradiating the substrate with light.

According to another aspect of the present invention, the thermal processing apparatus includes: a chamber housing a substrate; a susceptor provided inside the chamber and configured to support when the substrate is placed on the susceptor; a light irradiation unit configured to irradiate the substrate placed on the susceptor with light; a temperature measurement unit configured to measure the temperature of the susceptor; and a control unit configured to control the light irradiation unit so that the susceptor is heated through light irradiation by the light irradiation unit based on a result of the measurement of the temperature of the susceptor by the temperature measurement unit before the first substrate of a lot is transferred into the chamber.

A uniform temperature history can be achieved for all substrates of the lot without dummy running.

Preferably, the temperature measurement unit includes a plurality of temperature sensors configured to measure temperature at a plurality of places on the susceptor, and the control unit controls light irradiation by the light irradiation unit for each region including one of the plurality of places.

This achieves an improved accuracy of heating the susceptor.

Therefore, it is an object of the present invention to omit dummy running.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a perspective view illustrating the entire appearance of a holding unit;

FIG. 4 is a side view of the holding unit;

FIG. 5 is a plan view of a transfer mechanism;

FIG. 6 is a side view of the transfer mechanism;

FIG. 7 is a plan view illustrating arrangement of a plurality of halogen lamps;

DESCRIPTION OF THE PREFERRED EMBODIMENTS

Preferred embodiments of the present invention will be described in detail below with reference to the accompanying drawings.

First Preferred Embodiment

Figure 1:
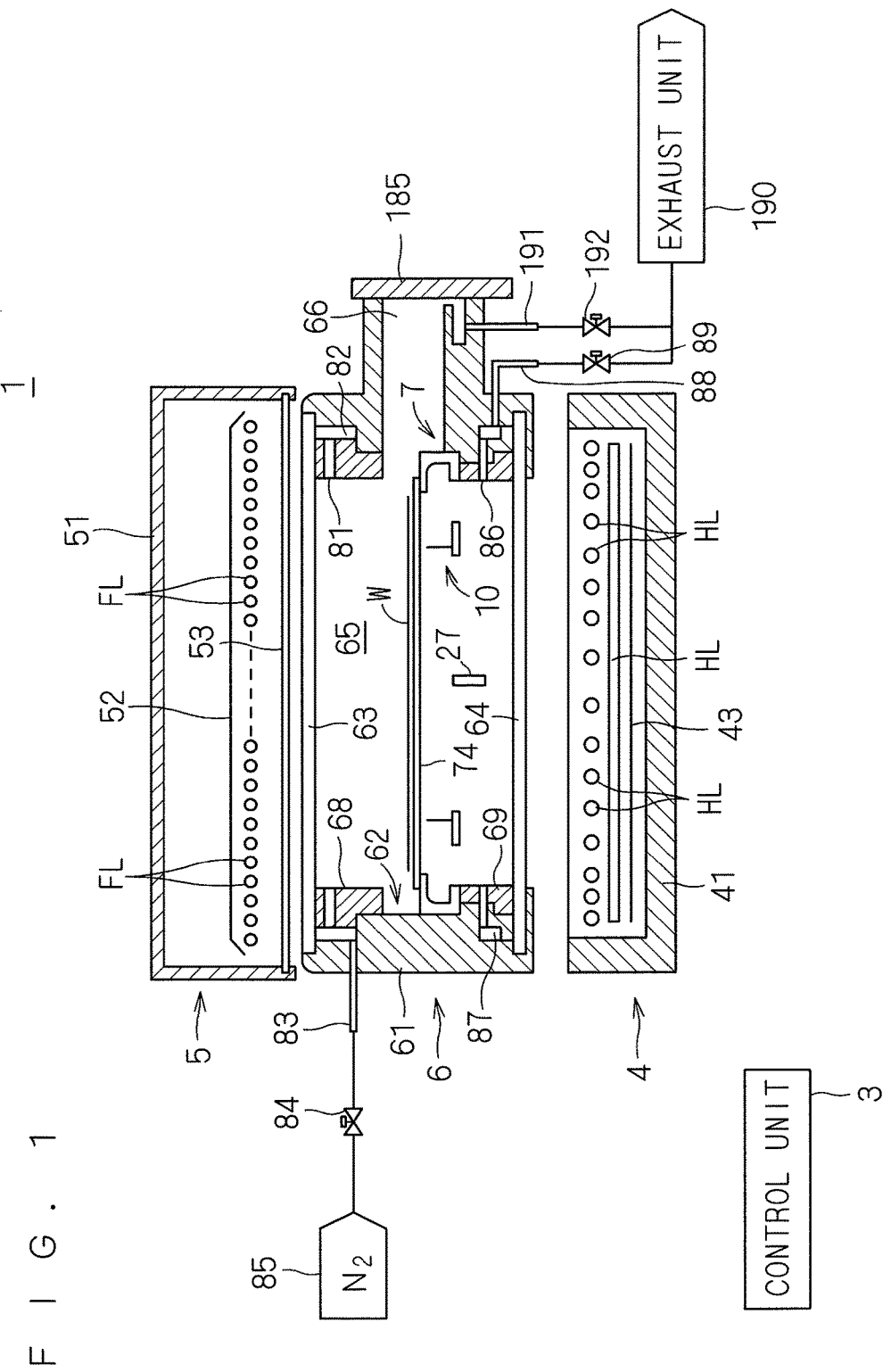
FIG. 1 is a vertical sectional view illustrating the configuration of a thermal processing apparatus according to the present invention.

FIG. 1 is a vertical sectional view illustrating the configuration of a thermal processing apparatus 1 according to the present invention. The thermal processing apparatus 1 according to the present preferred embodiment is a flash lamp annealing apparatus configured to heat a semiconductor wafer W, as a substrate, in a circular disk shape by irradiating the semiconductor wafer W with flash light. The size of the semiconductor wafer W to be processed is not particularly limited, but is, for example, φ 300 mm or φ 450 mm. Impurities are implanted in the semiconductor wafer W before being transferred into the thermal processing apparatus 1, and activation processing of the implanted impurities is executed through heating processing by the thermal processing apparatus 1. In FIG. 1 and the following drawings, the dimension of each component and the number thereof are exaggerated or simplified as necessary to facilitate understanding.

The thermal processing apparatus 1 includes a chamber 6 configured to house the semiconductor wafer W, a flash heating unit 5 including a plurality of built-in flash lamps FL, and a halogen heating unit 4 including a plurality of built-in halogen lamps HL. The flash heating unit 5 is provided above the chamber 6, and the halogen heating unit 4 is provided below the chamber 6. The thermal processing apparatus 1 also includes, inside the chamber 6, a holding unit 7 configured to hold the semiconductor wafer W in a horizontal posture, and a transfer mechanism 10 configured to transfer the semiconductor wafer W between the holding unit 7 and the outside of the apparatus. The thermal processing apparatus 1 also includes a control unit 3 configured to execute thermal processing of the semiconductor wafer W by controlling operation mechanisms provided to the halogen heating unit 4, the flash heating unit 5, and the chamber 6.

The chamber 6 is provided with a chamber window made of quartz mounted above and below a tubular chamber side part 61. The chamber side part 61 substantially has a tubular shape with openings at its upper and lower sides. The upper opening is closed by mounting an upper chamber window 63 thereon, and the lower opening is closed by mounting a lower chamber window 64 thereon. The upper chamber window 63 constituting the ceiling of the chamber 6 is a circular disk shape member made of quartz, and functions as a quartz window that transmits flash light emitted from the flash heating unit 5 into the chamber 6. The lower chamber window 64 constituting the floor of the chamber 6 is a circular disk shape member made of quartz, and functions as a quartz window that transmits light from the halogen heating unit 4 into the chamber 6.

A reflection ring 68 is mounted at an upper part of an inner wall surface of the chamber side part 61, and a reflection ring 69 is mounted at a lower part thereof. The reflection rings 68 and 69 are each formed in a circular ring. The upper reflection ring 68 is mounted by being inset from above the chamber side part 61. The lower reflection ring 69 is mounted by being inset from below the chamber side part 61 and fastened by a screw (not illustrated). In other words, the reflection rings 68 and 69 are detachably mounted on the chamber side part 61. A thermal processing space 65 is defined to be an inner space of the chamber 6, which is a space enclosed by the upper chamber window 63, the lower chamber window 64, the chamber side part 61, and the reflection rings 68 and 69.

When the reflection rings 68 and 69 are mounted on the chamber side part 61, a recess 62 is formed on an inner wall surface of the chamber 6. In other words, the recess 62 is formed, the recess 62 being enclosed by a central part of the inner wall surface of the chamber side part 61, where the reflection rings 68 and 69 are not mounted, a lower end surface of the reflection ring 68, and an upper end surface of the reflection ring 69. The recess 62 is formed in a circular ring on the inner wall surface of the chamber 6 along the horizontal direction, surrounding the holding unit 7 that holds the semiconductor wafer W.

The chamber side part 61 and the reflection rings 68 and 69 are made of a metal material (for example, stainless steel) that is excellent in strength and thermal resistance. The inner peripheral surfaces of the reflection rings 68 and 69 are mirrored by electrolytic nickel plating.

The chamber side part 61 is provided with a transfer opening (furnace entrance) 66 through which the semiconductor wafer W is transferred into and from the chamber 6. The transfer opening 66 can be opened and closed through a gate valve 185. The transfer opening 66 is communicated with the outer peripheral surface of the recess 62. With this configuration, when the transfer opening 66 is opened by the gate valve 185, the semiconductor wafer W can be transferred to and from the thermal processing space 65 through the transfer opening 66 and the recess 62. When the transfer opening 66 is closed by the gate valve 185, the thermal processing space 65 in the chamber 6 is sealed.

A gas supply hole 81 for supplying processing gas (nitrogen gas ($N_2$) in the present preferred embodiment) to the thermal processing space 65 is provided at an upper part of the inner wall of the chamber 6. The gas supply hole 81 is provided higher than the recess 62, and may be provided to the reflection ring 68. The gas supply hole 81 is communicated with a gas supply pipe 83 through a buffer space 82 formed in a circular ring on the inner sidewall of the chamber 6. The gas supply pipe 83 is connected with a nitrogen gas supply source 85. A valve 84 is inserted on the path of the gas supply pipe 83. When the valve 84 is opened, nitrogen gas is supplied from the nitrogen gas supply source 85 to the buffer space 82. Nitrogen gas flowing into the buffer space 82 spreads inside the buffer space 82 having a smaller fluid resistance than that of the gas supply hole 81 and is supplied to the thermal processing space 65 through the gas supply hole 81. The processing gas is not limited to nitrogen gas, but may be inert gas such as argon (Ar) or helium (He), or reactive gas such as oxygen ($O_2$), hydrogen ($H_2$), chlorine ($Cl_2$), hydrogen chloride (HCl), ozone ($O_3$), or ammonia ($NH_3$).

A gas exhaust hole 86 for exhausting gas in the thermal processing space 65 is provided at a lower part of the inner wall of the chamber 6. The gas exhaust hole 86 is provided lower than the recess 62, and may be provided to the reflection ring 69. The gas exhaust hole 86 is communicated with a gas exhaust pipe 88 through a buffer space 87 formed in a circular ring on the inner sidewall of the chamber 6. The gas exhaust pipe 88 is connected with an exhaust unit 190. A valve 89 is inserted on the path of the gas exhaust pipe 88. When the valve 89 is opened, gas in the thermal processing space 65 is exhausted to the gas exhaust pipe 88 through the gas exhaust hole 86 and the buffer space 87. A plurality of the gas supply holes 81 and the gas exhaust holes 86 may be provided along the circumferential direction of the chamber 6, and may be shaped in slits. The nitrogen gas supply source 85 and the exhaust unit 190 may be mechanisms provided to the thermal processing apparatus 1 or may be utilities of a factory at which the thermal processing apparatus 1 is installed.

Another gas exhaust pipe 191 for exhausting gas in the thermal processing space 65 is connected with a leading end of the transfer opening 66. The gas exhaust pipe 191 is connected with the exhaust unit 190 through a valve 192. When the valve 192 is opened, gas in the chamber 6 is exhausted through the transfer opening 66.

Figure 3:
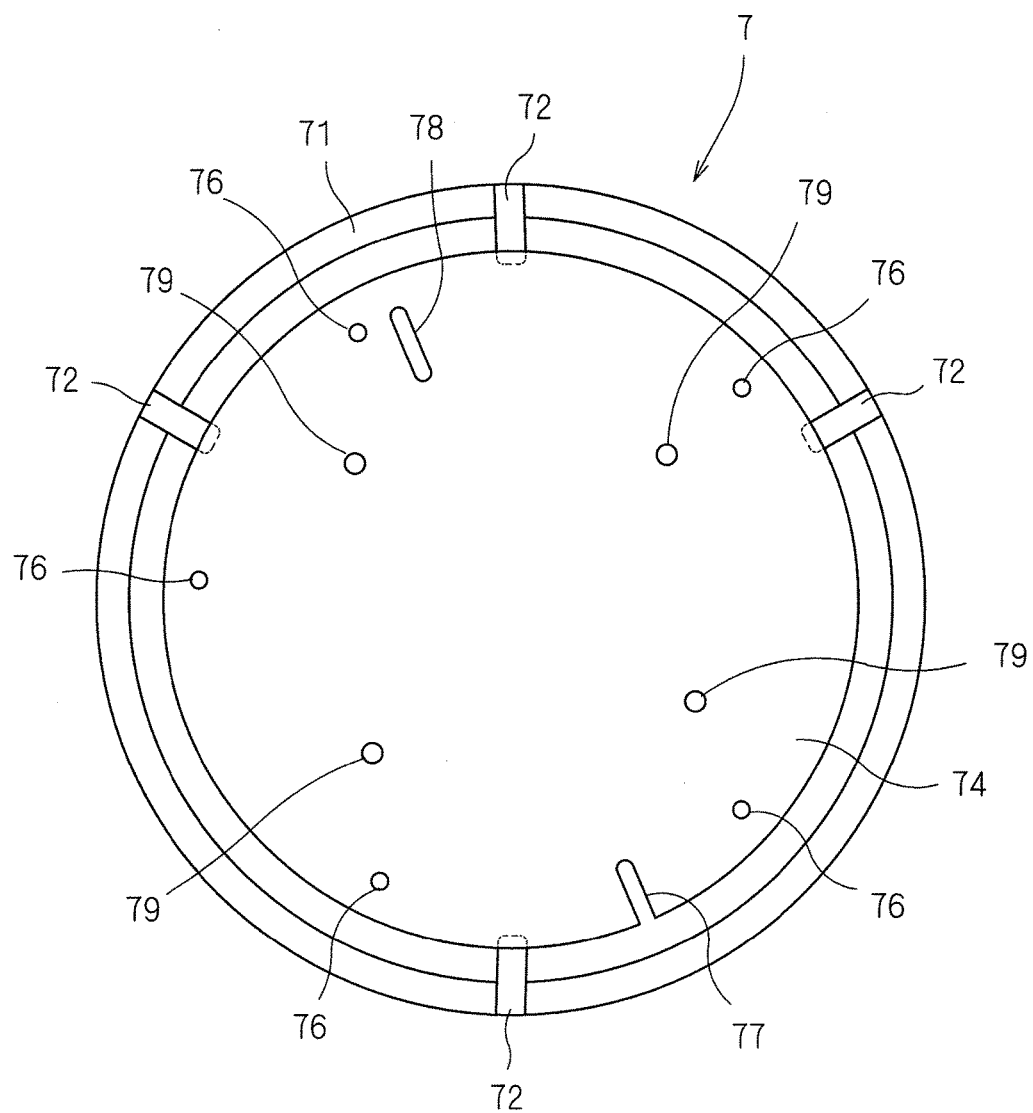
FIG. 3 is a plan view of the holding unit viewed from top.

FIG. 2 is a perspective view illustrating the entire appearance of the holding unit 7. FIG. 3 is a plan view of the holding unit 7 viewed from top, and FIG. 4 is a side view of the holding unit 7. The holding unit 7 includes a base ring 71, a coupling member 72, and a susceptor 74. The base ring 71, the coupling member 72, and the susceptor 74 are made of quartz. In other words, the entire holding unit 7 is made of quartz.

The base ring 71 is a quartz member having a circular ring shape. The base ring 71 is supported on the wall surface of the chamber 6 when placed on the bottom surface of the recess 62 (refer to FIG. 1). A plurality (in the present preferred embodiment, four) of the coupling members 72 are erected on the upper surface of the circular-ring base ring 71 along the circumferential direction thereof. The coupling member 72 is made of quartz and adhered to the base ring 71 by welding. The shape of the base ring 71 may be an arc, which is a circular ring with part thereof being lacked.

The flat plate susceptor 74 is supported by the four coupling members 72 provided to the base ring 71. The susceptor 74 is a flat plate member made of quartz and substantially having a circular shape. The susceptor 74 has a diameter larger than the diameter of the semiconductor wafer W. In other words, the susceptor 74 has a plane size larger than that of the semiconductor wafer W. A plurality (in the present preferred embodiment, five) of guide pins 76 are erected on the upper surface of the susceptor 74. The five guide pins 76 are provided on the periphery of a concentric circle of the outer peripheral circle of the susceptor 74. The circle on which the five guide pins 76 are arranged has a diameter slightly larger than the diameter of the semiconductor wafer W. Each guide pin 76 is also made of quartz. The guide pin 76 may be fabricated from quartz ingot integrally with the susceptor 74, or may be fabricated separately from the susceptor 74 and attached to the susceptor 74 by, for example, welding.

The four coupling members 72 erected on the base ring 71 are adhered to the lower surface of a peripheral part of the susceptor 74 by welding. In other words, the susceptor 74 and the base ring 71 are fixedly coupled with each other through the coupling members 72, and the holding unit 7 is an integrally formed quartz member. The base ring 71 of the holding unit 7 is supported on the wall surface of the chamber 6, and the holding unit 7 is mounted on the chamber 6. When the holding unit 7 is mounted on the chamber 6, the susceptor 74 substantially having a circular disk shape is in a horizontal posture (in which the normal thereof is aligned with the vertical direction). The semiconductor wafer W transferred into the chamber 6 is placed and held in a horizontal posture on the susceptor 74 of the holding unit 7 mounted on the chamber 6. The semiconductor wafer W is placed inside a circle formed by the five guide pins 76 to prevent any positional shift in the horizontal direction. The number of the guide pins 76 is not limited to five, but may be any number enough to prevent the positional shift of the semiconductor wafer W.

As illustrated in FIGS. 2 and 3, an opening 78 and a cutout 77 vertically penetrating are formed in the susceptor 74. The cutout 77 is a cutout provided through which a probe leading end part of a contact thermometer 130 using a thermocouple is placed. The opening 78 is provided to allow a radiation thermometer 120 to receive radiation light (infrared light) emitted from the lower surface of the semiconductor wafer W held by the susceptor 74. In addition, four through-holes 79 through which a lift pin 12 of the transfer mechanism 10 to be described later is penetrated for transferring of the semiconductor wafer W are drilled in the susceptor 74. The radiation thermometer 120 and the contact thermometer 130 are both configured to measure the temperature of the semiconductor wafer W, but not to measure the temperature of the holder 7 including the susceptor 74.

FIG. 5 is a plan view of the transfer mechanism 10. FIG. 6 is a side view of the transfer mechanism 10. The transfer mechanism 10 includes two transfer arms 11. The transfer arms 11 each have an arc shape along the substantially circular ring shape of the recess 62. The two lift pins 12 are erected on each transfer arm 11. Each transfer arm 11 can be rotated by a horizontal movement mechanism 13. The horizontal movement mechanism 13 allows the pair of transfer arms 11 to horizontally move between a transfer operation position (position illustrated by a solid line in FIG. 5) at which the transfer mechanism 10 performs transfer of the semiconductor wafer W onto the holding unit 7, and a retracted position (position illustrated by a dashed and double-dotted line in FIG. 5) at which the transfer arms 11 do not overlap with the semiconductor wafer W held by the holding unit 7 in plan view. The horizontal movement mechanism 13 may be configured to rotate individually the transfer arms 11 through individual motors, or may be configured to rotate the pair of transfer arms 11 in a cooperative manner through one motor using a link mechanism.

The pair of transfer arms 11 are moved up and down together with the horizontal movement mechanism 13 by an elevation mechanism 14. When the elevation mechanism 14 moves up the pair of transfer arms 11 at the transfer operation position, a total of four of the lift pins 12 passes through the through-holes 79 (refer to FIGS. 2 and 3) drilled in the susceptor 74, so that the upper ends of the lift pins 12 stick out of the upper surface of the susceptor 74. When the elevation mechanism 14 moves down the pair of transfer arms 11 at the transfer operation position to remove the lift pins 12 from the through-holes 79, and the horizontal movement mechanism 13 moves the pair of transfer arms 11 to open, the transfer arms 11 are moved to the retracted position. The retracted position of the pair of transfer arms 11 is located directly above the base ring 71 of the holding unit 7. Since the base ring 71 is placed on the bottom surface of the recess 62, the retracted position of the transfer arms 11 is located inside the recess 62. An exhaust mechanism (not illustrated) is provided near positions at which the driving units (the horizontal movement mechanism 13 and the elevation mechanism 14) of the transfer mechanism 10 are provided, so as to exhaust atmosphere around the driving units of the transfer mechanism 10 out of the chamber 6.

As illustrated in FIGS. 1 and 2, a radiation thermometer 27 is provided inside the chamber 6. The radiation thermometer 27 is a temperature sensor configured to detect infrared light emitted from the susceptor 74 of the holder 7 to measure the temperature of the susceptor 74. In the first preferred embodiment, the radiation thermometer 27 is installed at a position at which the radiation thermometer 27 can measure temperature at a central part of the susceptor 74.

The flash heating unit 5 provided above the chamber 6 includes, inside a housing 51, a light source including a plurality (in the present preferred embodiment, thirty) of the xenon flash lamps FL, and a reflector 52 provided to cover above the light source. A lamp light emission window 53 is mounted on a bottom part of the housing 51 of the flash heating unit 5. The lamp light emission window 53 constituting the floor of the flash heating unit 5 is a plate quartz window made of quartz. Since the flash heating unit 5 is installed above the chamber 6, the lamp light emission window 53 and the upper chamber window 63 face to each other. The flash lamps FL irradiate the thermal processing space 65 with flash light from above the chamber 6 through the lamp light emission window 53 and the upper chamber window 63 to perform flash heating of the semiconductor wafer W.

The plurality of flash lamps FL are each a bar lamp having a long cylinder shape and are arrayed in a plane such that the longitudinal directions of the flash lamps FL are parallel to each other along a main surface of the semiconductor wafer W held by the holding unit 7 (along the horizontal direction). The plane of the array of the flash lamps FL is a horizontal plane.

Figure 8:
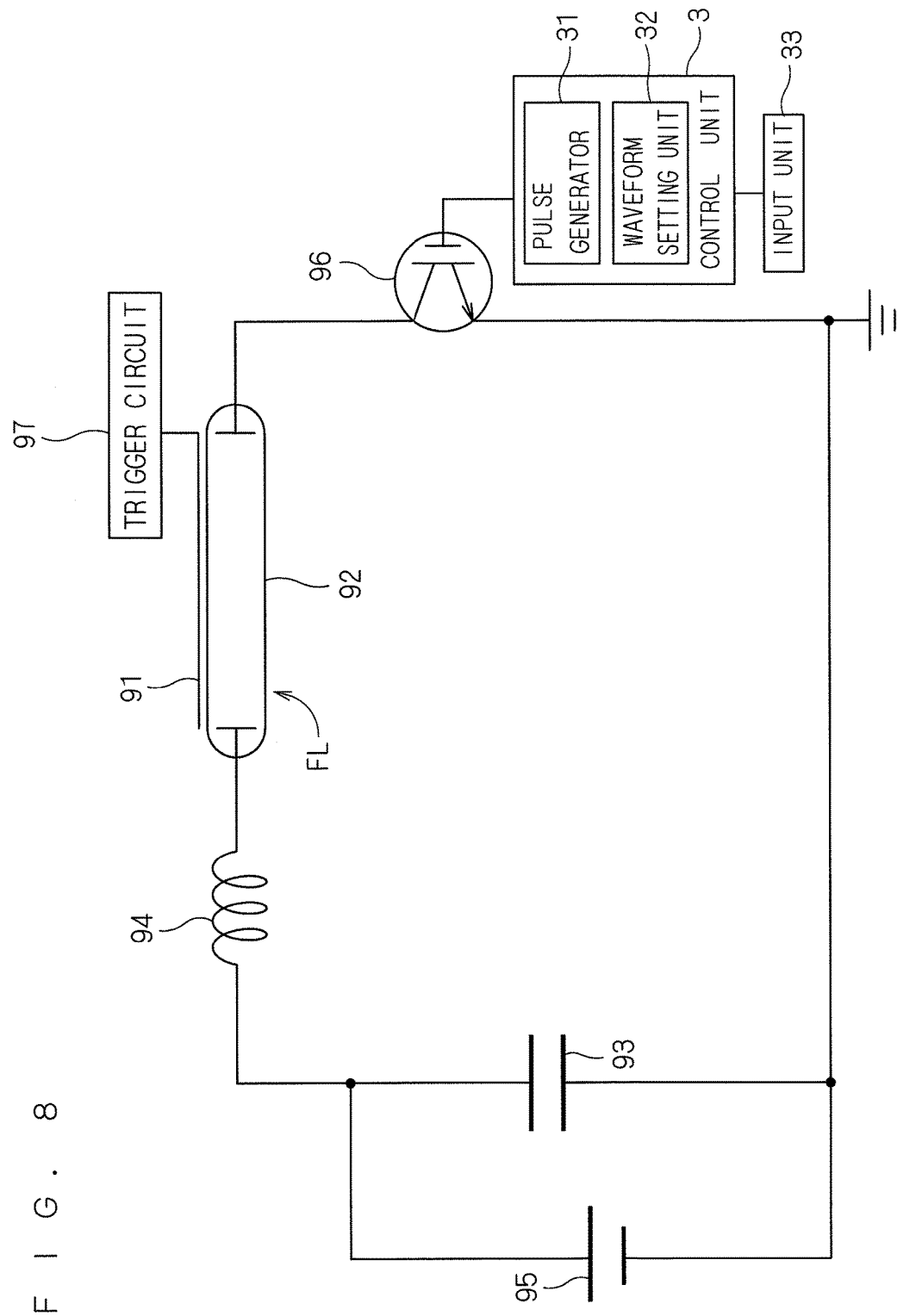
FIG. 8 is a diagram illustrating a drive circuit of a flash lamp.

FIG. 8 is a diagram illustrating a drive circuit of each flash lamp FL. As illustrated in FIG. 8, a capacitor 93, a coil 94, the flash lamp FL, and an IGBT (insulated gate bipolar transistor) 96 are connected with each other in series. As illustrated in FIG. 8, the control unit 3 includes a pulse generator 31 and a waveform setting unit 32, and is connected with an input unit 33. The input unit 33 may be various kinds of well-known input instruments such as a keyboard, a mouse, and a touch panel. The waveform setting unit 32 sets the waveform of a pulse signal based on the content of input from the input unit 33, and then the pulse generator 31 generates a pulse signal in accordance with the waveform.

The flash lamp FL includes a glass tube (discharge tube) 92 in which xenon gas is encapsulated and at both end parts of which an anode and a cathode are arranged, and a trigger electrode 91 additionally provided on the outer peripheral surface of the glass tube 92. The capacitor 93 receives predetermined voltage applied by a power unit 95, and stores therein electric charge in accordance with the applied voltage (charge voltage). The trigger electrode 91 can receive high voltage applied from a trigger circuit 97. A timing at which the trigger circuit 97 applies voltage to the trigger electrode 91 is controlled by the control unit 3.

The IGBT 96 is a bipolar transistor in which a metal oxide semiconductor field effect transistor (MOSFET) is incorporated in a gate, and is a switching element suitable for treating a large amount of electrical power. The gate of the IGBT 96 receives a pulse signal applied from the pulse generator 31 of the control unit 3. The IGBT 96 becomes an ON state when a voltage (High voltage) equal to or higher than a predetermined value is applied to the gate of the IGBT 96, and the IGBT 96 becomes an OFF state when a voltage (Low voltage) lower than the predetermined value is applied. In this manner, the drive circuit including the flash lamp FL is turned on and off through the IGBT 96. Connection between the flash lamp FL and the corresponding capacitor 93 is turned on and off by turning on and off the IGBT 96, thereby controlling turning on and off of current flowing through the flash lamp FL.

When the IGBT 96 is turned on while the capacitor 93 is charged, and high voltage is applied to the end-part electrodes of the glass tube 92, no electricity flows in the glass tube 92 in a normal state since xenon gas is electrically an insulator. However, when the trigger circuit 97 applies high voltage to the trigger electrode 91 to break the insulation, current instantaneously flows in the glass tube 92 through discharge between the end-part electrodes, and light is released through excitation of xenon atom or molecule.

The drive circuit as illustrated in FIG. 8 is individually provided to each of the plurality of flash lamps FL provided to the flash heating unit 5. In the present preferred embodiment, the thirty flash lamps FL are arrayed in a plane, and thus the thirty corresponding drive circuits as illustrated in FIG. 8 are provided.

The reflector 52 is provided above the plurality of flash lamps FL, covering the entire flash lamps FL. A basic function of the reflector 52 is to reflect, toward the thermal processing space 65, flash light emitted from the plurality of flash lamps FL. The reflector 52 is formed as an aluminum alloy plate, and has a surface (facing to the flash lamps FL) provided with roughing fabrication by blast processing.

The halogen heating unit 4 provided below the chamber 6 includes a plurality (in the present preferred embodiment, forty) of the built-in halogen lamps HL inside a housing 41. The halogen heating unit 4 is a light irradiator configured to heat the semiconductor wafer W by irradiating the thermal processing space 65 with light from below the chamber 6 through the lower chamber window 64 by using the plurality of halogen lamps HL. The halogen heating unit 4 irradiates the lower surface of the semiconductor wafer W supported by the susceptor 74 with halogen light through the susceptor 74 made of quartz.

FIG. 7 is a plan view illustrating arrangement of the plurality of halogen lamps HL. The forty halogen lamps HL are arranged separately in upper and lower parts. The twenty halogen lamps HL are arranged in the upper part closer to the holding unit 7, and the twenty halogen lamps HL are arranged in the lower part farther from the holding unit 7 than the upper part. Each halogen lamp HL is a bar lamp having a long cylinder shape. In each of the upper part and the lower part, the twenty halogen lamps HL are arrayed such that the longitudinal directions of the halogen lamps HL are parallel to each other along the main surface of the semiconductor wafer W held by the holding unit 7 (along the horizontal direction). In the upper and lower parts, the plane of the array of the halogen lamps HL is a horizontal plane.

As illustrated in FIG. 7, in the upper and lower parts, the halogen lamps HL have a higher arrange density in a region opposite to a peripheral part of the semiconductor wafer W held by the holding unit 7 than in a region opposite to a central part of the semiconductor wafer W. In other words, in the upper and lower parts, the halogen lamps HL have a shorter arrange pitch in the peripheral part of the lamp array than in the central part thereof. With this configuration, irradiation with a larger light quantity can be performed in the peripheral part of the semiconductor wafer W, in which temperature fall is likely to occur at heating through irradiation with light from the halogen heating unit 4.

A lamp group of the halogen lamps HL in the upper part and a lamp group of the halogen lamps HL in the lower part are arrayed so as to intersect with each other in a lattice. In other words, a total of forty of the halogen lamps HL are arranged such that the longitudinal directions of the twenty halogen lamps HL arranged in the upper part and the longitudinal directions of the twenty halogen lamps HL arranged in the lower part are orthogonal to each other.

Each halogen lamp HL is a filament-type light source that energizes a filament arranged inside the glass tube to make the filament in candescent and causes light emission. The glass tube encapsulates inert gas such as nitrogen or argon introduced with a small amount of halogen element (iodine or bromine, for example). The introduction of halogen element allows the temperature of the filament to be set to a high temperature while reducing damage on the filament. Thus, the halogen lamp HL has a long life and is capable of continuously emitting light with a high intensity as compared to a normal filament lamp. In other words, the halogen lamp HL is a continuously lighting lamp configured to emit light continuously for at least one second or longer. Since the halogen lamp HL is a bar lamp, the halogen lamp HL has a long life, and the halogen lamp HL achieves an excellent efficiency of emission to the semiconductor wafer W held above the halogen lamp HL, when arranged in the horizontal direction. Output of the forty halogen lamps HL is individually adjustable by the control unit 3.

A reflector 43 is provided in the housing 41 of the halogen heating unit 4 below the two stages of the halogen lamps HL (FIG. 1). The reflector 43 reflects light emitted from the plurality of halogen lamps HL toward the thermal processing space 65.

The control unit 3 controls the above-described various kinds of operation mechanisms provided to the thermal processing apparatus 1. The control unit 3 has a hardware configuration same as that of a typical computer. In other words, the control unit 3 includes a CPU that is a circuit configured to perform various kinds of arithmetic processing, a ROM as a read-only memory configured to store therein a basic computer program, a RAM as a writable memory configured to store therein various kinds of information, and a magnetic disk configured to store therein control software and data. Processing in the thermal processing apparatus 1 is proceeded by the CPU of the control unit 3 executing a predetermined processing program. As illustrated in FIG. 8, the control unit 3 includes the pulse generator 31 and the waveform setting unit 32. As described above, the waveform setting unit 32 sets the waveform of a pulse signal based on the content of input from the input unit 33, and then the pulse generator 31 outputs a pulse signal to the gate of the IGBT 96 in accordance with the waveform.

The thermal processing apparatus 1 includes, in addition to the above-described configuration, various cooling structures to prevent excessive rise in the temperature of the halogen heating unit 4, the flash heating unit 5, and the chamber 6 due to thermal energy generated from the halogen lamps HL and the flash lamps FL at the thermal processing of the semiconductor wafer W. For example, a water-cooling tube (not illustrated) is provided to the wall of the chamber 6. The halogen heating unit 4 and the flash heating unit 5 have air cooling structures in which gas flow is generated to release heat. Air is supplied to a gap between the upper chamber window 63 and the lamp light emission window 53 so as to cool the flash heating unit 5 and the upper chamber window 63.

The following describes a procedure of processing the semiconductor wafer W in the thermal processing apparatus 1. The semiconductor wafer W to be processed is a semiconductor substrate to which impurities (ions) are added by the ion implantation technique. The impurities are activated through flash light irradiation heating processing (annealing) by the thermal processing apparatus 1. A procedure of processing by the thermal processing apparatus 1 described below proceeds as the control unit 3 controls each operation mechanism of the thermal processing apparatus 1.

First, before heating processing on the semiconductor wafer W to be processed, the susceptor 74 is preheated by the forty halogen lamps HL of the halogen heating unit 4. That is, before the first semiconductor wafer W included in a lot is transferred into the chamber 6, the forty halogen lamps HL of the halogen heating unit 4 are turned on under control of the control unit 3 to heat the susceptor 74 of the holder 7. Part of light emitted from the halogen lamps HL toward the thermal processing space 65 is absorbed by the susceptor 74 made of quartz, so that the temperature of the susceptor 74 is increased accordingly.

The increasing temperature of the susceptor 74 is measured by the radiation thermometer 27. However, when the semiconductor wafer W is placed on the susceptor 74, light emitted from the lower surface of the semiconductor wafer W transmits through the susceptor 74 to become disturbance light, which makes it difficult to measure the temperature of the susceptor 74 through the radiation thermometer 27. The semiconductor wafer W to be processed is not placed on the susceptor 74 before being transferred into the chamber 6, which allows the radiation thermometer 27 to measure the temperature of the susceptor 74.

The temperature of the susceptor 74 measured by the radiation thermometer 27 is transmitted to the control unit 3. The control unit 3 performs feedback control of the output of the halogen lamps HL so that the temperature of the susceptor 74 becomes a predetermined temperature based on a result of the measurement of the temperature of the susceptor 74 by the radiation thermometer 27. The susceptor 74 is heated to 200° C. to 300° C. by the halogen lamps HL. This heating temperature will be described later in detail. The control unit 3 does not start processing of the semiconductor wafer W to be processed until the temperature of the susceptor 74 reaches the above-described predetermined temperature. When the temperature of the susceptor 74 reaches the predetermined temperature, the halogen lamps HL are temporarily turned off.

When the valve 84 is opened for air supply and the valves 89 and 192 are opened for air exhaust, air supplying and discharging to and from the chamber 6 is started in parallel to the preheating of the susceptor 74. When the valve 84 is opened, nitrogen gas is supplied into the thermal processing space 65 through the gas supply hole 81. When the valve 89 is opened, gas in the chamber 6 is exhausted through the gas exhaust hole 86. With this configuration, nitrogen gas supplied from an upper part of the thermal processing space 65 in the chamber 6 flows downward and is exhausted from a lower part of the thermal processing space 65.

When the valve 192 is opened, gas in the chamber 6 is exhausted through the transfer opening 66, atmosphere around the driving units of the transfer mechanism 10 is exhausted by the exhaust mechanism (not illustrated). At the thermal processing of the semiconductor wafer W in the thermal processing apparatus 1, nitrogen gas is continuously supplied to the thermal processing space 65, and the amount of the supply is changed as appropriate in accordance with a processing process.

After the temperature of the susceptor 74 measured by the radiation thermometer 27 is risen to the predetermined temperature, the control unit 3 starts thermal processing of the first semiconductor wafer W of a lot in the thermal processing apparatus 1. At start of the processing, the gate valve 185 is opened to open the transfer opening 66, and the semiconductor wafer W in which ions are implanted is transferred into the thermal processing space 65 in the chamber 6 through the transfer opening 66 by a transfer robot outside of the apparatus. The semiconductor wafer W transferred in by the transfer robot is moved to a position directly above the holder 7 and stops there. Then, the pair of transfer arms 11 of the transfer mechanism 10 horizontally move from the retracted position to the transfer operation position and rise, so that the lift pins 12 stick out of the upper surface of the susceptor 74 through the through-hole 79 so as to receive the semiconductor wafer W.

After the semiconductor wafer W is placed on the lift pins 12, the transfer robot leaves the thermal processing space 65, the transfer opening 66 is closed by the gate valve 185. Then, the pair of transfer arms 11 are moved down to pass the semiconductor wafer W from the transfer mechanism 10 onto the susceptor 74 of the holder 7, so that the semiconductor wafer W is held from below in a horizontal posture. The semiconductor wafer W is placed on the susceptor 74 with a front surface on which pattern formation is provided and impurities are implanted being held upward. The semiconductor wafer W is placed inside the five guide pins 76 on the upper surface of the susceptor 74. When moved down to below the susceptor 74, the pair of transfer arms 11 is retracted to the retracted position, in other words, the inside of the recess 62 by the horizontal movement mechanism 13.

When the semiconductor wafer W is held from below in a horizontal posture by the holding unit 7 made of quartz, all of the forty halogen lamps HL of the halogen heating unit 4 are turned on to start preheating (assist heating). Halogen light emitted from the halogen lamps HL transmits through the lower chamber window 64 and the susceptor 74 made of quartz and irradiates the back surface (main surface opposite to the front surface) of the semiconductor wafer W. The semiconductor wafer W is preheated by receiving the light irradiation from the halogen lamps HL, and the temperature of the semiconductor wafer W rises.

When the preheating by the halogen lamps HL is performed, the temperature of the semiconductor wafer W is measured by the contact thermometer 130. Specifically, the contact thermometer 130 including a built-in thermocouple contacts with the lower surface of the semiconductor wafer W held by the holding unit 7, through the cutout 77 of the susceptor 74 to measure the rising wafer temperature. The measured temperature of the semiconductor wafer W is transmitted to the control unit 3. The control unit 3 controls output of the halogen lamps HL while monitoring whether the temperature of the semiconductor wafer W, which is risen through the light irradiation from the halogen lamps HL, reaches a predetermined preheating temperature T1. In other words, the control unit 3 performs feedback control of the output of the halogen lamps HL based on a value measured by the contact thermometer 130 so that the temperature of the semiconductor wafer W becomes equal to the preheating temperature T1. The preheating temperature T1 is 200° C. to 800° C. approximately, and preferably 350° C. to 600° C. approximately, at which diffusion of the impurities added to the semiconductor wafer W by heat is unlikely to occur (in the present preferred embodiment, 600° C.). The measurement of the temperature of the semiconductor wafer W may be performed by the radiation thermometer 120 in place of or in addition to the contact thermometer 130.

After the temperature of the semiconductor wafer W has reached the preheating temperature T1, the control unit 3 temporarily maintains the semiconductor wafer W at the preheating temperature T1. Specifically, when the temperature of the semiconductor wafer W measured by the contact thermometer 130 reaches the preheating temperature T1, the control unit 3 adjusts the output of the halogen lamps HL to maintain the temperature of the semiconductor wafer W substantially at the preheating temperature T1.

The temperature of the entire semiconductor wafer W is uniformly risen to the preheating temperature T1 through the preheating by the halogen lamps HL. At the preheating by the halogen lamps HL, the temperature of the peripheral part of the semiconductor wafer W, from which heat is more likely to be released, tends to fall below the temperature of the central part of the semiconductor wafer W. However, the arrange density of the halogen lamps HL in the halogen heating unit 4 is higher in the region opposite to the peripheral part of the semiconductor wafer W than in the region opposite to the central part of the semiconductor wafer W (refer to FIG. 7). With this configuration, a larger amount of light is incident on the peripheral part of the semiconductor wafer W, from which heat is likely to be released, thereby achieving a uniform in-plane temperature distribution of the semiconductor wafer W at the preheating. In addition, since the inner peripheral surface of the reflection ring 69 mounted on the chamber side part 61 is mirrored, a larger amount of light is reflected toward the peripheral part of the semiconductor wafer W by the inner peripheral surface of the reflection ring 69, thereby further achieving a uniform in-plane temperature distribution of the semiconductor wafer W at the preheating.

When a predetermined time has elapsed after the temperature of the semiconductor wafer W reached the preheating temperature T1, the flash lamps FL of the flash heating unit 5 irradiate the surface of the semiconductor wafer W with flash light. Electric charge is previously accumulated on the capacitor 93 by the power unit 95 before the irradiation with flash light by the flash lamps FL. Then, while electric charge is accumulated on the capacitor 93, a pulse signal is output from the pulse generator 31 of the control unit 3 to the IGBT 96 so as to turn on and off drive of the IGBT 96.

The waveform of the pulse signal can be defined by inputting, from the input unit 33, a recipe in which time (ON time) of a pulse width and time (OFF time) of a pulse interval are sequentially set as parameters. When such a recipe is input to the control unit 3 by an operator through the input unit 33, the waveform setting unit 32 of the control unit 3 sets a pulse waveform that repeats on and off in accordance with the recipe. Then, the pulse generator 31 outputs a pulse signal in accordance with the pulse waveform set by the waveform setting unit 32. Accordingly, the pulse signal having the set waveform is applied to the gate of the IGBT 96 to control the turning on and off of drive of the IGBT 96. Specifically, the IGBT 96 becomes the ON state when the pulse signal input to the gate of the IGBT 96 is on, and the IGBT 96 becomes the OFF state when the pulse signal is off.

The control unit 3 applies high voltage (trigger voltage) to the trigger electrode 91 by controlling the trigger circuit 97 in synchronization with a timing at which the pulse signal output from the pulse generator 31 becomes on. When the pulse signal is input to the gate of the IGBT 96 while electric charge is accumulated on the capacitor 93, and high voltage is applied to the trigger electrode 91 in synchronization with the timing at which the pulse signal becomes on, current always flows between the end-part electrodes in the glass tube 92, and light is released through excitation of xenon atom or molecule when the pulse signal is on.

In this manner, the thirty flash lamps FL of the flash heating unit 5 emit light to irradiate the front surface of the semiconductor wafer W placed on the susceptor 74 with flash light. When the flash lamps FL emit light without using the IGBT 96, however, electric charge accumulated on the capacitor 93 is consumed at one light emission, an output waveform from each flash lamp FL is a single pulse having a width of 0.1 millisecond to 10 milliseconds approximately. In contrast, according to the present preferred embodiment, the IGBT 96 as a switching element is connected in a circuit, and a pulse signal is output to the gate of the IGBT 96 to turn on and off, through the IGBT 96, supply of electric charge from the capacitor 93 to the flash lamp FL, thereby turning on and off current flowing through the flash lamp FL. Accordingly, chopper control is performed on light emission of the flash lamp FL, so that electric charge accumulated on the capacitor 93 is consumed in a divided manner, and the flash lamp FL repeats flashing in an extremely short time. Since the next pulse is applied to the gate of the IGBT 96 and the value of current increases again before the value of current flowing through the circuit becomes completely zero, the light emission does not have completely zero output while the flash lamps FL repeats flashing.

With this configuration, a light emission pattern of the flash lamp FL can be freely defined by controlling, through the IGBT 96, the turning on and off of current flowing through the flash lamps FL, and thus the time and intensity of light emission can be freely adjusted. Specifically, for example, when the ratio of the time of the pulse width relative to the time of the pulse interval input from the input unit 33 is increased, current flowing through the flash lamp FL is increased and thus the intensity of light emission is increased. In contrast, when the ratio of the time of the pulse width relative to the time of the pulse interval input from the input unit 33 is decreased, current flowing through the flash lamp FL is decreased and the intensity of light emission is decreased. The intensity of light emission of the flash lamp FL is constantly maintained by appropriately adjusting the ratio of the time of the pulse interval relative to the time of the pulse width input from the input unit 33. When the total time of a combination of the time of the pulse width and the time of the pulse interval input from the input unit 33 is increased, current continuously flows through the flash lamp FL for a relatively longer time and the flash lamp FL has a longer light emission time. The light emission time of the flash lamp FL is 1 second or less at maximum.

When irradiated with flash light from the thirty flash lamps FL, the semiconductor wafer W is subject to flash heating. The front surface temperature of the semiconductor wafer W subject to the flash heating instantaneously rises to a processing temperature T2 equal to or higher than 1,000° C. to activate the impurities implanted in the semiconductor wafer W, and then the front surface temperature rapidly falls. Since the flash lamps FL emit light during the light irradiation by the halogen lamps HL, the front surface temperature of the semiconductor wafer W falls to the vicinity of the preheating temperature T1.

The halogen lamps HL are turned off after a predetermined time has elapsed after the flash heating processing ended. Accordingly, the temperature of the semiconductor wafer W rapidly falls from the preheating temperature T1. The temperature of the semiconductor wafer W during the fall is measured by the contact thermometer 130 or the radiation thermometer 120, and a result of the measurement is transmitted to the control unit 3. The control unit 3 monitors whether the temperature of the semiconductor wafer W falls to a predetermined temperature based on the result of the measurement. Then, after the temperature of the semiconductor wafer W falls below the predetermined temperature, the pair of transfer arms 11 of the transfer mechanism 10 are horizontally moved from the retracted position to the transfer operation position and risen again, so that the lift pins 12 stick out of the upper surface of the susceptor 74 to receive, from the susceptor 74, the semiconductor wafer W after the thermal processing. Subsequently, the transfer opening 66 closed by the gate valve 185 is opened, the semiconductor wafer W placed on the lift pins 12 is transferred out by the transfer robot outside of the apparatus, which completes the heating processing of the semiconductor wafer W in the thermal processing apparatus 1.

Typically, the processing of the semiconductor wafer W is performed in units of lots. A lot is a set of the semiconductor wafers W to be subject to processing of identical contents under identical conditions. In the thermal processing apparatus 1 according to the present preferred embodiment, a plurality of the semiconductor wafers W included in a lot are sequentially transferred into the chamber 6 one by one to be subject to the heating processing.

When the thermal processing apparatus 1 that has not performed processing for a while starts processing of a lot without performing the above-described preheating of the susceptor 74, the first semiconductor wafer W of the lot is transferred into the chamber 6 substantially at room temperature and subject to the flash heating processing. Examples of such a case include a case in which the first lot is processed after the thermal processing apparatus 1 has been started after maintenance, and a case in which a long time has elapsed since processing of the last lot. At the heating processing, thermal conduction occurs from the semiconductor wafer W the temperature of which has been risen to the susceptor 74 and the like in the chamber, the temperature of the susceptor 74, which was initially at room temperature, is gradually risen by heat accumulation as the number of processed semiconductor wafers W increases.

Figure 9:
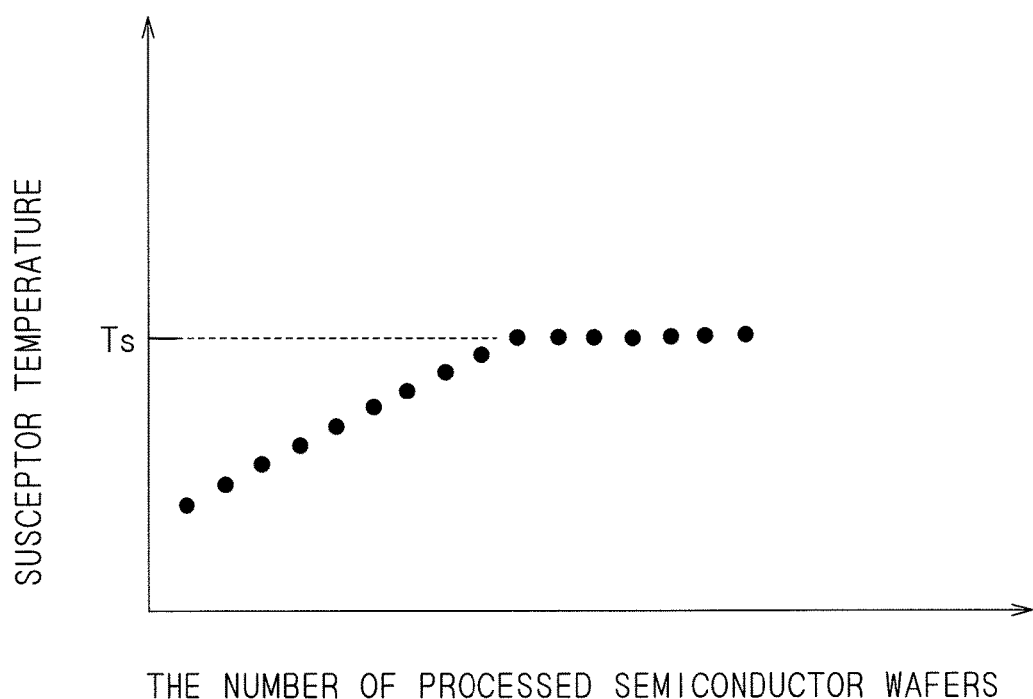
FIG. 9 is a diagram illustrating a correlation between the number of processed semiconductor wafers and the temperature of a susceptor.

FIG. 9 is a diagram illustrating a correlation between the number of processed semiconductor wafers W and the temperature of the susceptor 74. The temperature of the susceptor 74, which was at room temperature before the processing starts, is gradually risen by heat transfer from the semiconductor wafer W as the number of processed semiconductor wafers W increases. Then, when the heating processing is performed on approximately 10 semiconductor wafers W, the temperature of the susceptor 74 reaches a constant stable temperature Ts. In the susceptor 74, which has reached the stable temperature Ts, the amount of heat transfer from the semiconductor wafer W to the susceptor 74 is balanced with the amount of heat discharge from the susceptor 74. The amount of heat transfer from the semiconductor wafer W is larger than the amount of heat discharge from the susceptor 74 until the temperature of the susceptor 74 reaches the stable temperature Ts, and thus the temperature of the susceptor 74 is gradually risen by heat accumulation as the number of processed semiconductor wafers W increases. In contrast, since the amount of heat transfer from the semiconductor wafer W is balanced with the amount of heat discharge from the susceptor 74 after the temperature of the susceptor 74 has reached the stable temperature Ts, the temperature of the susceptor 74 is maintained at the constant stable temperature Ts.

When the processing is started on the chamber 6 at room temperature as described above, the semiconductor wafer W in an early part of a lot and the semiconductor wafer W in the following part of the lot are supported by the susceptor 74 at different temperatures, which results in an ununiform temperature history. In addition to this ununiform temperature history, the semiconductor wafer W in the early part is subject to the flash heating processing while being supported by the susceptor 74 at low temperature, which causes wafer warpage in some cases. For this reason, as described above, before the processing of the lot is started, dummy running is conventionally performed that a dummy wafer that is not a processing target is transferred into the chamber 6 and subject to the same flash heating processing as that on the semiconductor wafer W to be processed so that the temperatures of the susceptor 74 and the like in the chamber are risen to the stable temperature Ts.

In the present preferred embodiment, the susceptor 74 is preheated through light irradiation by the halogen lamps HL before the first semiconductor wafer W of a lot is transferred into the chamber 6. During the preheating, the control unit 3 controls the output of the halogen lamps HL so that the temperature of the susceptor 74 reaches the above-described stable temperature Ts based on a result of the measurement of the temperature of the susceptor 74 by the radiation thermometer 27. Specifically, the stable temperature Ts is obtained in advance by, for example, experiment or simulation and stored in a storage unit of the control unit 3. Then, the light irradiation heating of the susceptor 74 is performed while the control unit 3 controls the output of the halogen lamps HL so that the temperature of the susceptor 74 measured by the radiation thermometer 27 reaches the stable temperature Ts.

The stable temperature Ts is the temperature of the susceptor 74 when the temperature of the susceptor 74 is risen to a constant temperature by continuously performing the light irradiation heating on a plurality of the semiconductor wafers W of a lot in the chamber 6 without preheating the susceptor 74. The stable temperature Ts differs depending on the preheating temperature T1 of the semiconductor wafer W included in the lot, but is in a range of 200° C. to 300° C. Then, the thermal processing of the first semiconductor wafer W of the lot is started after the temperature of the susceptor 74 has risen to the stable temperature Ts.

Since the temperature of the susceptor 74 is risen to the stable temperature Ts through light irradiation by the halogen lamps HL before the thermal processing of the first semiconductor wafer W of the lot is started, all semiconductor wafers W of the lot are supported by the susceptor 74 at the same temperature, thereby achieving a uniform temperature history. In addition, the semiconductor wafer W in the early part of the lot is supported by the susceptor 74 the temperature of which is risen to the stable temperature Ts, thereby preventing wafer warpage due to a temperature difference between the susceptor 74 and the semiconductor wafer W. Accordingly, the conventional dummy running, in which heating processing is performed on several dummy wafers, can be omitted, so that the substrate processing apparatus 1 can be efficiency operated.

Second Preferred Embodiment

The following describes a second preferred embodiment of the present invention. The entire schematic configuration of a thermal processing apparatus and a procedure of processing the semiconductor wafer W according to the second preferred embodiment are substantially same as those of the first preferred embodiment, but the number of radiation thermometers configured to measure the temperature of the susceptor 74 is different from the first preferred embodiments. Although the single radiation thermometer 27 is provided to measure temperature at a central part of the susceptor 74 in the first preferred embodiment, a plurality of radiation thermometers are provided to measure temperature at a plurality of places on the susceptor 74 in the second preferred embodiment.

Specifically, in the second preferred embodiment, a total of three radiation thermometers of a radiation thermometer configured to measure temperature at a central part of the susceptor 74, a radiation thermometer configured to measure temperature at an edge part of the susceptor 74, and a radiation thermometer configured to measure temperature at a middle part between the central part and the edge part of the susceptor 74 are installed. In the second preferred embodiment, the light irradiation by the halogen heating unit 4 is controlled for each region including one of a plurality of temperature measurement places on the susceptor 74. In other words, zone control of the temperature of the susceptor 74 is performed.

Figure 10:
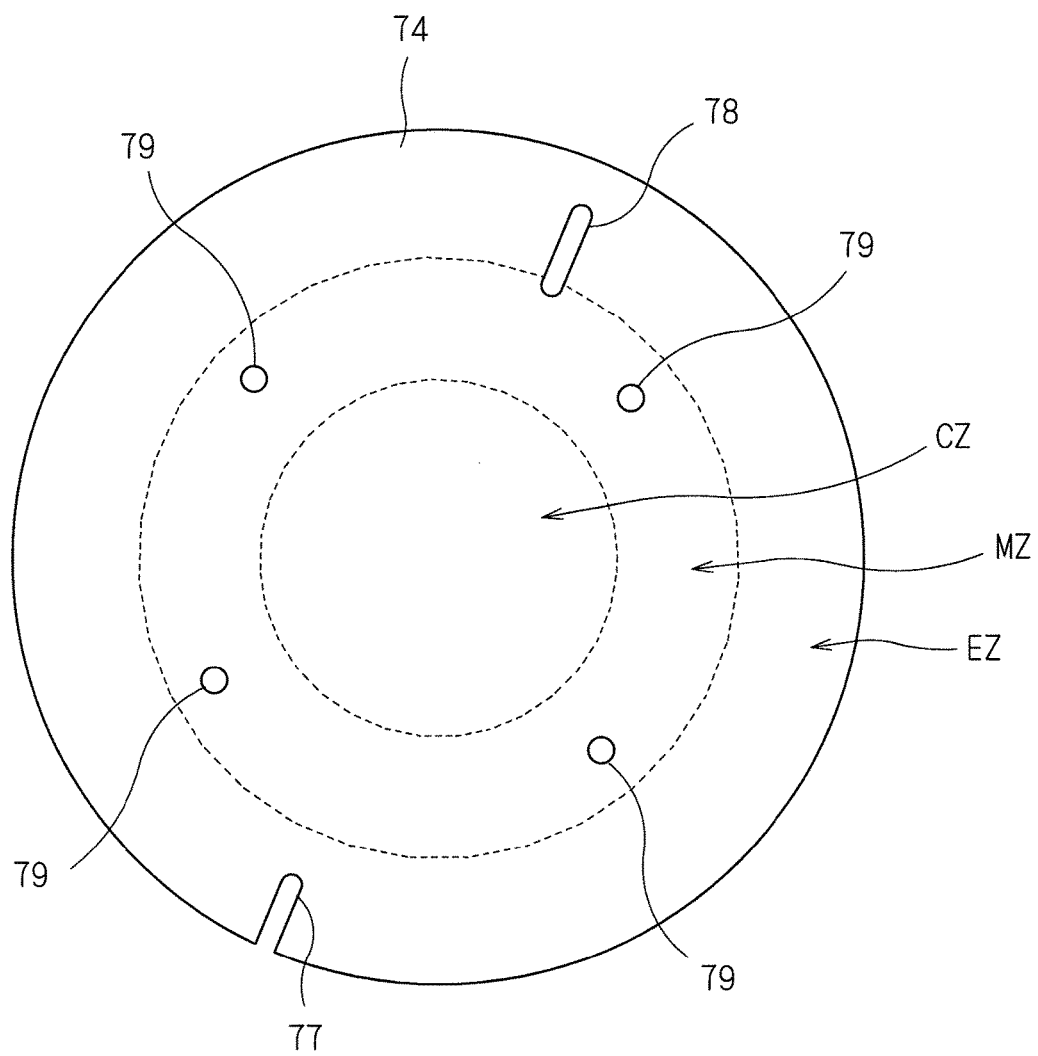
FIG. 10 is a diagram illustrating exemplary zone control of the temperature of the susceptor.

FIG. 10 is a diagram illustrating exemplary zone control of the temperature of the susceptor 74. The susceptor 74 having a substantially circular shape is divided into three regions of a central zone CZ, a middle zone MZ, and an edge zone EZ that are concentric circles. The above-described three radiation thermometers measure temperature at the central zone CZ, the middle zone MZ, and the edge zone EZ, respectively. Then, the control unit 3 controls the output of the halogen lamps HL so that temperature at the central zone CZ, the middle zone MZ, and the edge zone EZ each reaches the stable temperature Ts based on a result of the measurement of temperature at the central zone CZ, the middle zone MZ, and the edge zone EZ by the three radiation thermometers. The output of the forty halogen lamps HL is individually adjustable, and thus the control unit 3 can adjust the output of the halogen lamps HL corresponding to the central zone CZ, the middle zone MZ, and the edge zone EZ. For example, when temperature at the edge zone EZ on the susceptor 74 is lower than temperature at the central zone CZ and the middle zone MZ, the control unit 3 increases the output of the halogen lamps HL (the halogen lamps HL positioned below the edge zone EZ) corresponding to the edge zone EZ so as to increase the quantity of light incident on the edge zone EZ. Accordingly, the edge zone EZ on the susceptor 74 is heated intensively to have the same temperature as that at the central zone CZ and the middle zone MZ, so that the entire susceptor 74 is uniformly heated to the stable temperature Ts.

The second preferred embodiment has the same configuration as that of the first preferred embodiment except for the zone control of the temperature of the susceptor 74 through a plurality of radiation thermometers. In the second preferred embodiment, the temperature of the susceptor 74 is risen to the stable temperature Ts through light irradiation by the halogen lamps HL before the thermal processing of the first semiconductor wafer W of a lot is started, and thus all semiconductor wafers W of the lot are supported by the susceptor 74 at the same temperature, thereby achieving a uniform temperature history. In addition, the semiconductor wafer W in an early part of a lot is supported by the susceptor 74 the temperature of which has risen to the stable temperature Ts, thereby preventing wafer warpage due to a temperature difference between the susceptor 74 and the semiconductor wafer W. Accordingly, the conventional dummy running, in which heating processing is performed on several dummy wafers, can be omitted, so that the substrate processing apparatus 1 can be efficiency operated. In addition, in the second preferred embodiment, since the zone control of the temperature of the susceptor 74 is performed through a plurality of radiation thermometers, the temperature of the susceptor 74 can be risen accurately and uniformly.

Modification

The above describes the preferred embodiments of the present invention, but various kinds of modifications of the present invention other than those described above can be performed without departing from the scope of the present invention. For example, in the above-described preferred embodiments, the susceptor 74 is heated by the halogen lamps HL for preheating the semiconductor wafer W, but the present invention is not limited thereto, and the susceptor 74 made of quartz may be heated by a dedicated heating mechanism such as a resistive heater.

In the above-described preferred embodiments, the temperature of the susceptor 74 is measured by a radiation thermometer, but may be measured by a contact thermometer including a thermocouple.

The temperature of the susceptor 74 does not necessarily need to be accurately measured because it is difficult to accurately measure the temperature of the susceptor 74 made of quartz through the radiation thermometer 27. Specifically, since it is sufficient to only know that the temperature of the susceptor 74 reaches the stable temperature Ts, the control unit 3 may perform relative comparison between the temperature of the susceptor 74 measured by the radiation thermometer 27 and the stable temperature Ts, when controlling the output of the halogen lamps HL so that the temperature difference becomes zero. In this case, however, the stable temperature Ts needs to be measured by the same radiation thermometer 27 through experiment in advance. Moreover, the control unit 3 may control the output of the halogen lamps HL so that the output of the radiation thermometer 27 when the stable temperature Ts is measured is equal to the output of the radiation thermometer 27 when the temperature of the susceptor 74 to be preheated is measured.

In the second preferred embodiment, the three radiation thermometers are provided and the susceptor 74 is divided into the three zones to perform the zone control, but the present invention is not limited thereto. Two or more of temperature sensors may be provided to perform heating control for each region including one of a plurality of temperature measurement places.

In the second preferred embodiment, the heating control is performed to achieve the same temperature at all zones of the susceptor 74, but may be performed to achieve different temperatures in the respective zones of the susceptor 74 depending on a processing purpose. For example, in order to prevent relative temperature reduction in a peripheral part of the semiconductor wafer W at preheating, the output of the halogen lamps HL may be controlled so that temperature at the edge zone EZ on the susceptor 74 is higher than temperature at the central zone CZ and the middle zone MZ.

In the above-described preferred embodiments, the light emission of the flash lamps FL is controlled by the IGBT 96, but the IGBT 96 is not necessarily an essential element. When the flash lamps FL are configured to emit light without using the IGBT 96, the same effect as those of the above-described preferred embodiments can be obtained through the configuration that the temperature of the susceptor 74 is risen to the stable temperature Ts before the thermal processing of the first semiconductor wafer W of a lot is started.

Although the thirty flash lamps FL are provided to the flash heating unit 5 in each of the above-described preferred embodiments, the present invention is not limited thereto, and an optional number of the flash lamps FL may be provided. Each flash lamp FL is not limited to a xenon flash lamp, but may be a krypton flash lamp. The number of the halogen lamps HL included in the halogen heating unit 4 is not limited to forty, but may be optional as long as a plurality of halogen lamps are arranged in upper and lower parts.

A substrate to be processed by the thermal processing apparatus according to the present invention is not limited to a semiconductor wafer, but may be a glass substrate used for a flat panel display such as a liquid crystal display device or a substrate for a solar battery. The technology according to the present invention is also applicable to thermal processing of a high-dielectric-constant gate insulating film (high-k film), bonding of metal and silicon, and crystallization of polysilicon.

While the invention has been shown and described in detail, the foregoing description is in all aspects illustrative and not restrictive. It is therefore understood that numerous modifications and variations can be devised without departing from the scope of the invention.

What is claimed is:

1. A thermal processing apparatus configured to heat a substrate by irradiating the substrate with light, the apparatus comprising:
    a chamber housing a substrate;
    a susceptor provided inside said chamber and configured to support when the substrate is placed on said susceptor;
    a light irradiation unit configured to irradiate the substrate placed on said susceptor with light;
    a temperature measurement unit configured to measure the temperature of said susceptor; and
    a control unit configured to control said light irradiation unit so that said susceptor is heated through light irradiation by said light irradiation unit based on a result of the measurement of the temperature of said susceptor by said temperature measurement unit before the first substrate of a lot is transferred into said chamber,
    wherein
        when a stable temperature is set as the temperature of said susceptor when the temperature of said susceptor is risen to a constant temperature by continuously irradiating a plurality of substrates of a lot with light from said light irradiation unit to heat the substrates without heating said susceptor,
        said control unit controls said light irradiation unit so that the temperature of said susceptor reaches said stable temperature.

2. The thermal processing apparatus according to claim 1, wherein
    said temperature measurement unit includes a plurality of temperature sensors configured to measure temperature at a plurality of places on said susceptor, and
    said control unit controls light irradiation by said light irradiation unit for each region including one of said plurality of places.

3. The thermal processing apparatus according to claim 1, wherein
    said light irradiation unit includes a flash lamp configured to irradiate the substrate with flash light from one side of said chamber.

4. The thermal processing apparatus according to claim 3, wherein
    said light irradiation unit further includes a halogen lamp configured to irradiate the substrate with light from the other side of said chamber, and
    said susceptor is heated through light irradiation by said halogen lamp.

* * * * *